(12) United States Patent
Lee

(10) Patent No.: US 7,691,741 B2
(45) Date of Patent: Apr. 6, 2010

(54) METHOD OF FORMING BIT LINE IN SEMICONDUCTOR DEVICE

(75) Inventor: Sung Hoon Lee, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 190 days.

(21) Appl. No.: 11/401,585

(22) Filed: Apr. 11, 2006

(65) Prior Publication Data
US 2006/0240673 A1 Oct. 26, 2006

(30) Foreign Application Priority Data
Apr. 22, 2005 (KR) .................. 10-2005-0033712

(51) Int. Cl.
*H01L 21/4763* (2006.01)

(52) U.S. Cl. .................. 438/639; 257/E21.575

(58) Field of Classification Search .......... 438/700, 438/736, 586, 257, 239, 253, 254, 672, 622, 438/675, 637, 629, 639; 257/E21.578, E21.579, 257/E21.575, E21.252, E21.507, 758, 301
See application file for complete search history.

(56) References Cited

U.S. PATENT DOCUMENTS

| | | | | |
|---|---|---|---|---|
| 5,726,102 A * | 3/1998 | Lo | .............. | 438/718 |
| 6,165,839 A * | 12/2000 | Lee et al. | .............. | 438/253 |
| 6,300,191 B1 * | 10/2001 | Yu et al. | .............. | 438/253 |
| 6,911,397 B2 * | 6/2005 | Jun et al. | .............. | 438/700 |
| 7,348,240 B2 * | 3/2008 | Cho | .............. | 438/257 |
| 2002/0064941 A1 * | 5/2002 | Chooi et al. | .............. | 438/633 |
| 2002/0102807 A1 * | 8/2002 | Kim et al. | .............. | 438/386 |
| 2002/0111013 A1 * | 8/2002 | Okada et al. | .............. | 438/627 |
| 2002/0187627 A1 * | 12/2002 | Yuang | .............. | 438/622 |
| 2003/0044725 A1 * | 3/2003 | Hsue et al. | .............. | 430/314 |
| 2003/0077897 A1 * | 4/2003 | Tsai et al. | .............. | 438/633 |

(Continued)

FOREIGN PATENT DOCUMENTS

KR    2004-3524    1/2004

(Continued)

OTHER PUBLICATIONS

Official action issued in corresponding Korean application No. 2005-33712 dated Apr. 20, 2006.

*Primary Examiner*—W. David Coleman
*Assistant Examiner*—Latanya Crawford
(74) *Attorney, Agent, or Firm*—Marshall, Gerstein & Borun LLP

(57) ABSTRACT

A method of forming a bit line of a semiconductor device wherein an etch-stop nitride film, a trench oxide film and a hard mask nitride film are formed on a semiconductor substrate. The hard mask nitride film and the trench oxide film are etched to a limited etch thickness of a photo mask. The remaining trench oxide film is etched using the hard mask nitride film as a mask, thus forming a trench. The etch-stop nitride film and the hard mask nitride film are etched on condition that an oxide film has a high selectivity with respect to a nitride film. Accordingly, the loss of a top surface of the trench oxide film can be minimized and a bit line can be formed to have a uniform height. In accordance with the invention, bit line resistance and capacitance variation can be reduced and the reliability of a device can be improved.

10 Claims, 3 Drawing Sheets

U.S. PATENT DOCUMENTS

| | | | |
|---|---|---|---|
| 2003/0139034 A1* | 7/2003 | Yuang | 438/634 |
| 2003/0186537 A1* | 10/2003 | Yamanaka et al. | 438/637 |
| 2003/0215983 A1* | 11/2003 | Bae et al. | 438/118 |
| 2004/0126973 A1* | 7/2004 | Lee | 438/262 |
| 2004/0127052 A1* | 7/2004 | Lee et al. | 438/700 |
| 2004/0137743 A1* | 7/2004 | Chung et al. | 438/700 |
| 2004/0147112 A1* | 7/2004 | Tsu et al. | 438/637 |
| 2004/0166666 A1* | 8/2004 | Usami | 438/629 |
| 2004/0166667 A1* | 8/2004 | Lee | 438/637 |
| 2005/0003646 A1* | 1/2005 | Park et al. | 438/586 |
| 2005/0020075 A1* | 1/2005 | Lee | 438/689 |
| 2005/0067673 A1* | 3/2005 | Geffken et al. | 257/573 |
| 2005/0176241 A1* | 8/2005 | Ryu | 438/633 |
| 2005/0239288 A1* | 10/2005 | Peng et al. | 438/687 |

FOREIGN PATENT DOCUMENTS

| | | |
|---|---|---|
| KR | 2004-65444 | 7/2004 |

* cited by examiner

METHOD OF FORMING BIT LINE IN SEMICONDUCTOR DEVICE

BACKGROUND OF THE INVENTION

1. Field of the Invention

The invention relates generally to semiconductor devices and more particularly, the invention relates to a method of forming a bit line of a semiconductor device in which resistance and capacitance variation in the bit line are reduced, thereby improving the reliability of the device.

2. Discussion of Related Art

A method of forming a bit line employing a damascene scheme in a semiconductor device manufacturing process uses an ArF photoresist as a mask when the pattern width is 70 nm or less. Accordingly, since the etch margin is small in the dry etch process, a problem arises because a top surface of the pattern is etched during a subsequent pattern formation process. To solve the problem, a pattern formation process employing a hard mask has been introduced.

In other words, a trench is formed in a line insulation film made of an oxide film using a hard mask film made of silicon nitride. After the hard mask film is stripped, the trench is buried with a metal film. A Chemical Mechanical Polishing (CMP) process is then performed to form a bit line within the trench.

However, since the etching selectivity between the silicon nitride film (i.e., the hard mask film) and the oxide film (i.e., the bit line insulation film) is poor, the top surface of the bit line insulation film is etched in pointed form during the process of stripping the hard mask film.

As a result, during the CMP process, the irregularity of etching between the cell region and the peripheral region is increased and the height of a bit line pattern is varied due to the etch irregularity. Accordingly, bit line resistance and capacitance variation are increased and the reliability of a device is degraded accordingly.

SUMMARY OF THE INVENTION

One embodiment of the invention relates to a method of forming a bit line of a semiconductor device in which a bit line insulation film can be prevented from being etched to a maximum when removing a hard mask.

Another embodiment of the invention relates to the improvements of the etch regularity of a CMP process for forming a bit line.

Still another embodiment of the invention relates to improvements of the reliability of a device by reducing bit line resistance and capacitance variation.

A method of forming a bit line of a semiconductor device according to an embodiment of the invention includes the steps of sequentially forming a bit line of a semiconductor device, the method comprising the steps of stacking an etch-stop nitride film, a trench oxide film and a hard mask nitride film on a semiconductor substrate, forming a photo mask on a predetermined region of the hard mask nitride film, and etching a predetermined thickness of the hard mask nitride film and the trench oxide film using the photo mask as a mask, stripping the photo mask, etching the trench oxide film remaining on the etch-stop nitride film using the hard mask nitride film as a mask, thereby forming a trench, stripping the etch-stop nitride film below the hard mask nitride film and the trench, forming wet barriers on sidewalls of the trench, and forming a bit line within the trench.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1A:
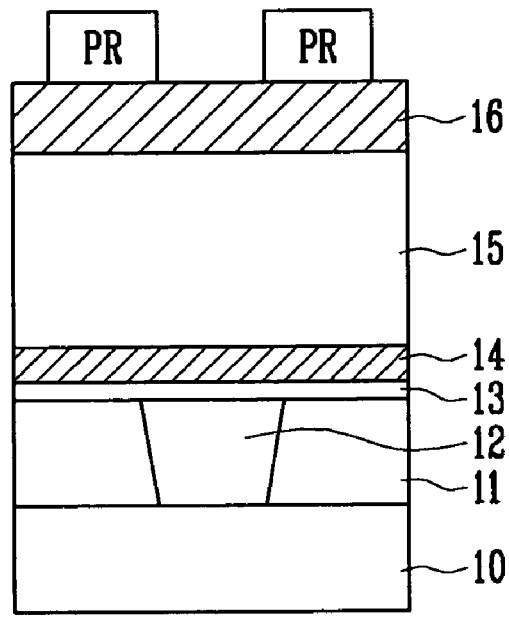
FIGS. 1a to 1f are cross-sectional views illustrating a method of forming bit lines of a semiconductor device according to an embodiment of the invention.

In the following detailed description, only a certain exemplary embodiment of the invention are shown and are described simply by way of illustration. As those skilled in the art will realize, the described embodiment may be modified in various different ways, all without departing from the spirit or scope of the invention. Accordingly, the drawings and description are to be regarded as illustrative in nature and not restrictive. Like reference numerals designate like elements throughout.

FIGS. 1a to 1f are cross-sectional views illustrating a method of forming bit lines of a semiconductor device according to an embodiment of the present invention.

As shown in FIG. 1a, an etch-stop oxide film 13 is formed on an interlayer insulation film 11 in which a drain poly plug 12 connected to a semiconductor substrate 10 is formed. A silicon nitride film is deposited on the etch-stop oxide film 13 to form an etch-stop nitride film 14.

A trench oxide film 15 for insulating bit lines is then formed on the etch-stop nitride film 14. A silicon nitride film is deposited on the trench oxide film 15 to form a hard mask film 16.

Thereafter, a photoresist (PR) is coated on the hard mask film 16 and the photoresist (PR) is patterned by exposure and development processes.

Figure 1B:
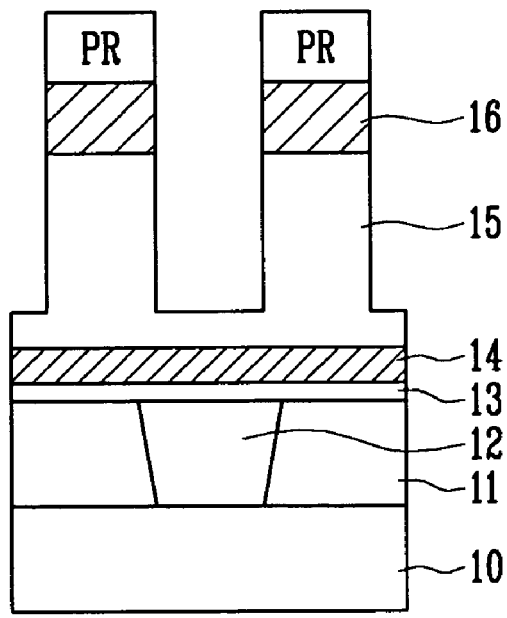

As shown in FIG. 1b, the hard mask film 16 and the trench oxide film 15 are etched to a limited etch thickness of the photoresist (PR) using the patterned photoresist (PR) as a mask. When a lower layer is etched using the photoresist (PR), the photoresist (PR) is also recessed. When a thickness of a lower layer to be etched is greater than the limited etch thickness of the photoresist (PR), the photoresist (PR) cannot properly serve as an etch mask with respect to the lower layer. Accordingly, a portion of the trench oxide film 15 is etched such that the etch process is performed to the limited etch thickness of the photoresist (PR).

In the related art, only the hard mask film has been etched during the etch process using the photoresist as the mask. In an embodiment of the invention, however, not only the hard mask film 16, but also the trench oxide film 15 is partially etched. Therefore, the loss of the hard mask film 16 can be minimized by reducing an etch target thickness of the etch process using the hard mask film 16.

The photoresist (PR) is then stripped.

The strip process of the photoresist (PR) may be performed in-situ or ex-situ in an apparatus in which the etch process on the hard mask film 16 and the trench oxide film 15 has been performed.

Figure 1C:
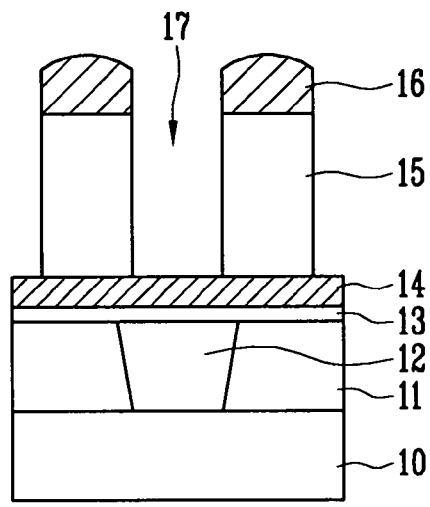

As shown in FIG. 1c, the remnant trench oxide film 15 using the hard mask film 16 as a mask is etched to form a trench 17. At this time, the etch-stop nitride film 14 is used as an etch stopper so that the etching is stopped on the etch-stop nitride film 14.

In the embodiment shown, a thickness of the trench oxide film 15, which is an etch target, is smaller than those in the related art. Accordingly, an amount of the hard mask film 16 lost during the etch process can be reduced. Furthermore, a material constituting the etch-stop nitride film 14 is a silicon nitride film, which is the same as that of the hard mask film 16. Therefore, an amount of the hard mask film 16 can be minimized during the etch process using the etch-stop nitride film 14 as the etch stopper.

Figure 1D:
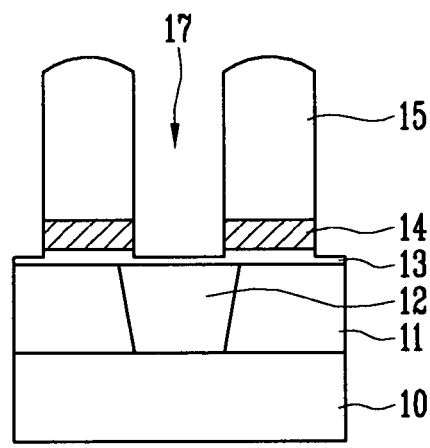

The etch-stop nitride film 14 and the hard mask film 16 are then stripped as shown in FIG. 1d.

At this time, the etch process is carried out on condition that the oxide film has a high selectivity with respect to the nitride film. Accordingly, since the etch-stop oxide film 13 made of an oxide film serves as the etch stopper, the etch process can be stopped on the etch-stop oxide film 13. Although the hard mask film 16 is stripped, a top surface of the trench oxide film 15 does not become sharp, but has a predetermined thickness.

In order for the oxide film to have a high selectivity with respect to the nitride film, any one of a mixed gas of HBr and $O_2$, a mixed gas of HBr, $Cl_2$ and $O_2$, a mixed gas of HBr, $Cl_2$ and He, a mixed gas of HBr, $Cl_2$, $O_2$ and $SF_6$, a mixed gas of $Cl_2$ and $O_2$, and a mixed gas of HBr, $SF_6$ and $O_2$ may be used as an etch gas.

Figure 1E:
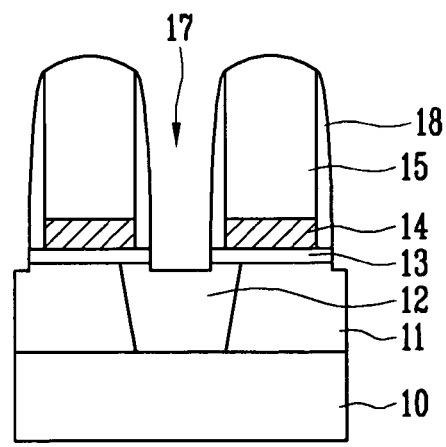
Figure 1F:
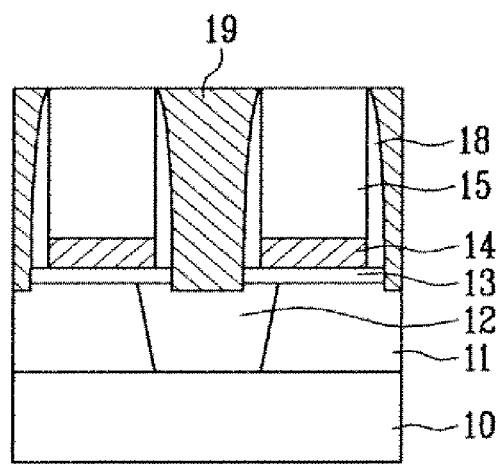

As shown in FIG. 1e, a silicon nitride film is formed on the entire surface in order to prevent the trench oxide film 15 from being lost in a subsequent wet cleaning process. The silicon nitride film is etched-back to form wet barriers 18 on both sidewalls of the trench 17.

Upon etch-back of the silicon nitride film, the etch-stop oxide film 13 on the drain poly plug 12 is also etched. Damage to an underlying drain poly plug 12 can be minimized due to the existence of the etch-stop oxide film 13.

Metal such as tungsten, copper, or aluminum is deposited on the entire surface so that the trench 17 is buried. The entire surface undergoes CMP to form a bit line 19 within the trench 17.

At this time, since the trench oxide film 15 does not have a pointed shape, variation in the CMP strip process is not great. Consequently, a bit line 19 having a uniform height can be formed.

The described embodiment of the present invention has the following advantages.

First, during an etch process using the photoresist as a mask, not only the hard mask film, but the trench oxide film are partially etched. Accordingly, since an etch target thickness of the etch process using the hard mask film as the mask can be reduced, a loss amount of the hard mask film and loss variation can be reduced.

Second, since a loss amount of the hard mask film and loss variation are reduced, variation in a thickness of the trench oxide film according to the strip process of the hard mask can be minimized.

Third, since variation in a thickness of the trench oxide film can be minimized, etch variation of the CMP process for forming a bit line can be minimized.

Fourth, since etch variation of the CMP process can be minimized, a bit line having a uniform height can be formed.

Fifth, since a bit line having a uniform height can be formed, bit line resistance and capacitance variation can be reduced.

Sixth, an etch-stop film made of an oxide film is formed below the trench oxide film. Therefore, the loss of an underlying drain poly plug can be reduced when etching the silicon nitride film for forming the wet barriers.

Seventh, since the loss of the drain poly plug can be reduced, bit line resistance can be reduced.

While the invention has been described in connection with what is presently considered to be a practical exemplary embodiment, it is to be understood that the invention is not limited to the disclosed embodiment, but, on the contrary, is intended to cover various modifications and equivalent arrangements included within the spirit and scope of the appended claims.

What is claimed is:

1. A method of forming a bit line of a semiconductor device, the method comprising sequentially:
   (a) stacking an etch-stop nitride film on a semiconductor substrate in which a contact plug is formed, a trench oxide film on the etch-stop nitride film, and a hard mask nitride film on the trench oxide film;
   (b) forming a photo mask on a predetermined region of the hard mask nitride film, and etching the hard mask nitride film and a predetermined thickness of the trench oxide film using the photo mask as a mask;
   (c) stripping the photo mask;
   (d) etching the trench oxide film remaining on the etch-stop nitride film using the hard mask nitride film as a mask to form a trench, thereby exposing the etch-stop nitride film;
   (e) stripping the hard mask nitride film and the etch-stop nitride film below the trench, thereby exposing the contact plug;
   (f) forming wet etch barriers on entire sidewalls of the trench; and
   (g) forming a bit line within the trench,
   wherein the wet etch barriers are formed before the contact plug is exposed.

2. The method of claim 1, wherein the predetermined thickness is the greatest thickness in which the photo mask can prevent a lower layer from being etched during the etch process of (b).

3. The method of claim 1, further comprising forming an etch-stop oxide film before forming the etch-stop nitride film in (a), and stripping the etch-stop oxide film below the trench to expose the contact plug.

4. The method of claim 1, comprising performing (b) and (c) in-situ.

5. The method of claim 1, comprising performing (b) and (c) ex-situ.

6. The method of claim 1, wherein (d) includes etching the trench oxide film using the etch-stop nitride film as a mask.

7. The method of claim 1, comprising performing (e) with an oxide film that has a high selectivity with respect to a nitride film.

8. The method of claim 1, comprising using a mixed gas selected from the group consisting of a mixed gas of HBr and $O_2$, a mixed gas of HBr, $Cl_2$ and $O_2$, a mixed gas of HBr, $Cl_2$ and He, a mixed gas of HBr, $Cl_{2,\ O2}$ and $SF_6$, a mixed gas of $Cl_2$ and $O_2$, and a mixed gas of HBr, $SF_6$ and $O_2$ as an etch gas.

9. The method of claim 1, wherein (f) comprises the steps of:
   forming a silicon nitride film on the entire surface; and
   etching back the silicon nitride film to form the wet etch barriers on sidewalls of the trench.

10. A method of forming a bit line of a semiconductor device, the method comprising sequentially:
   (a) stacking an etch-stop oxide film on a semiconductor substrate, an etch-stop nitride film on the etch-stop oxide film, a trench oxide film on the etch-stop oxide film, and a hard mask nitride film on the trench oxide film;

(b) forming a photo mask on a predetermined region of the hard mask nitride film, and etching the hard mask nitride film and a predetermined thickness of the trench oxide film using the photo mask as a mask;

(c) stripping the photo mask;

(d) etching the trench oxide film remaining on the etch-stop nitride film using the hard mask nitride film as a mask to form a trench, thereby exposing the etch-stop nitride film;

(e) stripping the hard mask nitride film and the etch-stop nitride film, thereby exposing the etch-stop oxide film;

(f) forming wet etch barriers on entire sidewalls of the trench; and (g) removing the etch-stop oxide film after forming the wet etch barriers.

* * * * *